(12) United States Patent
Dahmani

(10) Patent No.: US 8,597,975 B2
(45) Date of Patent: Dec. 3, 2013

(54) METHOD OF FABRICATING A MICROELECTRONIC DEVICE WITH PROGRAMMABLE MEMORY

(75) Inventor: Faiz Dahmani, La Varenne-Saint Hilaire (FR)

(73) Assignee: Altis Semiconductor, Corbeil Essonnes (FR)

( * ) Notice: Subject to any disclaimer, the term of this patent is extended or adjusted under 35 U.S.C. 154(b) by 0 days.

(21) Appl. No.: 13/539,751

(22) Filed: Jul. 2, 2012

(65) Prior Publication Data

US 2013/0126813 A1    May 23, 2013

(30) Foreign Application Priority Data

Jul. 5, 2011  (FR) ...................... 11 56033

(51) Int. Cl.
*H01L 21/00* (2006.01)
(52) U.S. Cl.
USPC ............. 438/95; 438/27; 438/102; 438/381; 257/2; 257/4; 257/98; 257/E21.438
(58) Field of Classification Search
USPC .......... 257/2–5, 55, 57, 98, E21.153; 438/27, 438/95, 102, 381–382, 384, 482, 542, 689
See application file for complete search history.

(56) References Cited

U.S. PATENT DOCUMENTS

| | | |
|---|---|---|
| 6,084,796 A | 7/2000 | Kozicki et al. |
| 2003/0155606 A1 | 8/2003 | Campbell |
| 2008/0217670 A1 | 9/2008 | Dhamani |
| 2011/0121254 A1 | 5/2011 | Dressler et al. |

OTHER PUBLICATIONS

International Search Report dated Feb. 2, 2012.
Above bandgap induced photoexpansion and photobleaching in Ga—Ge—S based glasses.
Evidence for nanoscale phase separation of stressed-rigid glasses.
Nature of glass transition in chalcogenides.
Rigidity transitions in Ge—Se glasses and the intermediate phase.

*Primary Examiner* — Mark A Laurenzi
(74) *Attorney, Agent, or Firm* — Sofer & Haroun, LLP

(57) ABSTRACT

A method is provided for fabricating a microelectronic device with programmable memory that includes: i) depositing an intermediate layer of a material having a chalcogenide on a first electrode; ii) irradiating the intermediate layer of step i with ultraviolet radiation; iii) depositing an ionizable metallic layer on the intermediate layer obtained in step ii; iv) diffusing the metal ions originating from the ionizable metallic layer of step iii into the intermediate layer to form a chalcogenide material containing metal ions; and v) depositing a second electrode on the layer of chalcogenide material containing metal ions obtained in step iv to form the microelectronic device.

14 Claims, 3 Drawing Sheets

METHOD OF FABRICATING A MICROELECTRONIC DEVICE WITH PROGRAMMABLE MEMORY

RELATED APPLICATION

This application claims the benefit of priority from French Patent Application No. 11 56033, filed on Jul. 5, 2011, the entirety of which is incorporated by reference.

BACKGROUND

1. Field of the Invention

The present invention relates to a method of fabricating a microelectronic device with programmable memory, as well as to a microelectronic device with programmable memory, obtained from said method.

2. Description of Related Art

Microelectronic devices with programmable memory are typically, but not exclusively, programmable ionic conduction (metallization) cells, which are computer memories known as "non-volatile" computer memories. Such programmable ionic conduction cells are well known by the acronyms CBRAM, standing for "conductive-bridging random access memory", or PMC, for "programmable metallization cell".

That type of microelectronic structures (CBRAM or PMC) is well known to the skilled person and has been described in document U.S. Pat. No. 6,084,796, for example, A CBRAM (or PMC) typically comprises a vertical stack of layers formed by a substrate based on a silicon type semiconductor on which the following layers are deposited in succession: an electrode termed the bottom electrode, a layer of a chalcogenide glass doped with silver (i.e. solid electrolyte), and an electrode termed the top electrode formed from silver. The layer of a chalcogenide glass is thus interposed between the bottom electrode and the top electrode.

Said electrodes are configured to cause a metallic dendrite to grow (i.e. formation of an electrically conductive bridge) from the negative of the two electrodes towards the positive of the two electrodes through the layer of doped chalcogenide glass when a voltage is applied between said electrodes. By applying an opposite voltage between said two electrodes, the reverse phenomenon is obtained, namely disappearance of the metallic dendrite (i.e. disappearance of the electrically conductive bridge) within the doped chalcogenide glass layer.

Thus, when the electrically conductive bridge is created (the step known as "writing"), the logic state of the device may be represented by "1", or may correspond to the "ON" state, whereas when the electrically conductive bridge disappears, the logic state of the cell may be represented by "0" or may correspond to the "OFF" state.

A first function that may be desired in CBRAMs is to have a microelectronic structure with a retention time (for information in the memory) that is as long as possible, which may in particular be induced by a compact layer of a chalcogenide glass. Once the electrically conductive bridge has been formed by applying a voltage between the two electrodes, the retention time corresponds to the lifetime of the electrically conductive bridge when said voltage is no longer applied.

A second desired function in CBRAMs is to have a microelectronic structure with higher electrical yield. The electrical yield of the memory structure may depend on the stoichiometry of the chalcogenide material, or in other words on the atomic percentage of the various elements that make up the chalcogenide material. Said stoichiometry is an essential factor in obtaining optimized electrical performances in programmable ionic conduction cells. As an example, when considering a chalcogenide based on germanium and sulfur with formula $Ge_xS_{100-x}$ in which x is an integer, the higher the sulfur content relative to the germanium, the better the electrical performance of programmable cells formed from that chalcogenide. An example of a chalcogenide with a high stoichiometry that may be mentioned is $GeS_2$. That particular type of stoichiometry has several advantages. It can improve the thermal stability of the chalcogenide and increase the solubility point of the doping metallic element in the chalcogenide during fabrication of said programmable cells, and thus increase the electrical performances of said cells. Thus, the more "stoichiometric" the chalcogenide, the higher can be the electrical yield of the microelectronic CBRAM structure.

However, it is known that a CBRAM microelectronic structure with a high yield, or in other words with a nigh stoichiometry, can in particular exhibit high mobility of silver ions within the layer of doped chalcogenide glass. However, high mobility of silver ions tends to perturb the stability of the electrically conductive bridge, thus the stability of the retention time.

OBJECTS AND SUMMARY

The aim of the present invention is to overcome the disadvantages of the prior art, in particular by proposing a method of fabricating a microelectronic device with programmable memory, which device has both yield and retention time optimized, preferably both being as high/long as possible.

The present invention provides a method of fabricating a microelectronic device with programmable memory, comprising the steps consisting in:

i) depositing an intermediate layer of a material comprising a chalcogenide on a first electrode;

ii) irradiating the intermediate layer of step i with ultraviolet radiation (i.e. irradiated intermediate layer);

iii) depositing an ionizable metallic layer on the intermediate layer obtained in step ii;

iv) diffusing the metal ions originating from the ionizable metallic layer of step iii into the intermediate layer to form a chalcogenide material containing metal ions (i.e. doped intermediate layer); and v) depositing a second electrode on the layer of chalcogenide material containing metal ions obtained in step iv to form said microelectronic device.

It has been discovered, surprisingly, that step ii can be used to obtain a microelectronic device with programmable memory, with a long information retention time while guaranteeing optimized stoichiometry, thus a high device yield.

The irradiation step ii is in particular carried out in a non-oxidizing atmosphere, (i.e. free of oxygen ($O_2$)), and preferably in an inert atmosphere, in order to avoid any photo-induced oxidation of the chalcogenide. As an example, it may be carried out in a nitrogen atmosphere or an atmosphere of one or more noble gases (column 18 of the periodic classification of the elements), or under vacuum.

In particular, irradiation step ii is carried out for a sufficient exposure time; and with an intensity sufficient for the intermediate layer irradiated in step ii to have a more compact structure, or in other words a structure that significantly limits or even prevents uncontrolled migration of metal ions (as compared with metal ions being present once step iv has been carried out)that could result, in particular, from thermal stressing during the fabrication of the microelectronic device (for example steps following step v). This change in compactness can readily be identified by the skilled person by comparing the atomic percentage of metal ions diffused (or dissolved) in an intermediate layer that has undergone steps i, ii, iii and iv, and an intermediate layer of an identical nature that has not undergone step ii (or in other words has only undergone steps i, iii and iv).

The intermediate layer, intended to be irradiated in step ii, is preferably a non-doped layer and more particularly a layer including no metallic element diffused within said intermediate layer.

In particular, no ionizable metallic layer can be deposited on the intermediate layer before step ii has been carried out. For this reason, irradiation by the ultraviolet radiation of step ii does not allow metal ions to diffuse through the intermediate layer in order to form a doped intermediate layer, since no ionisable metallic layer exists at this stage.

As a consequence, the intermediate layer formed during step ii is only an intermediate layer that can only be said "irradiated", and cannot be said "doped".

Thus, the intermediate layer obtained after irradiation in step ii and diffusion in step iv has a metal ion content reduced by at least 20%, preferably by at least 40%, relative to the metal ion content in the same intermediate layer obtained after diffusion in step iv, without having undergone the irradiation of step ii.

In a first particular implementation, the intensity of the ultraviolet radiation in step ii is greater than or equal to the intensity of the ultraviolet radiation in step iv. More particularly, the intensity of the ultraviolet radiation in step ii is at least 80 mW/cm$^2$ [milliwatt per square centimeter], preferably at least 150 mW/cm$^2$.

In a second particular implementation, the irradiation period in step ii is greater than or equal to the irradiation period in step iv. More particularly, the irradiation period in step ii is more than 5 minutes, and is preferably at least 10 minutes.

By convention, the ultraviolet radiation has a wavelength of 405 nm [nanometer] or less.

The method of the invention may also comprise a heat treatment step carried out prior to step iii, this step consisting in heating the intermediate layer to a temperature below or equal to the glass transition temperature of said intermediate layer.

This step is preferably carried out at a temperature of more than 25° C. This step is typically termed a high temperature heat treatment step, i.e. firing step.

The glass transition temperature of the intermediate layer of the invention may be measured by MDSC (modulated differential scanning calorimetry) with a temperature ramp-up of 3° C./min and a modulation rate of 1° C./100s.

As an example, the documents "P. Boolchand, X, Feng, W. J. Bresser: *Rigidity transition in binary Ge—Se glasses and intermediate phase*. J. Non-Cryst. Solids, 293, 348 (2001)"; "P. Boolchand, D. E. Georgiev, M. Micoulaut: *Nature of glass transition in chalcogenides*, Journal of Optoelectronics and Advanced Materials, Vol. 4, No. 4, 823 (2002)"; and "S. Mamedov, D. E Georgiev, Tao Qu, and P. Boolchand: *Evidence for nanoscale phase separation of stressed-rigid glasses*. J. Phys.: Condens. Matter 15 (2003)" provide examples of glass transition temperatures of chalcogenide glasses.

In a particular implementation, the heat treatment step is carried out at the same time as and/or following step ii.

When this heat treatment step is carried out at the same time as the irradiation step ii, at least the first electrode together with the intermediate layer (not yet doped) are generally positioned on the support (or "wafer carrier" or "sample carrier"), which is heated to a temperature below or equal to the glass transition temperature of the intermediate layer.

When this heat treatment is carried out after step ii, the (not yet doped) intermediate layer deposited on the first electrode may be positioned in an oven to heat said device to a temperature below or equal to the glass transition temperature of the intermediate layer.

This additional step may advantageously be used to optimize the compactness and/or the densification of the intermediate layer before step iii comprising the deposition of the ionizable metallic layer.

In a particular implementation, the temperature of this additional step (heat treatment) may be in the range 150° C. to 450° C., preferably 200° C. to 400° C. depending on the glass transition temperature of the intermediate layer of the chalcogenide (which depends on the initial stoichiometry of the chalcogenide).

Furthermore, the duration of this additional step may be in the range 5 minutes to 30 minutes (min), preferably in the range 5 min to 20 min.

In the present invention, the diffusion step iv may be used to diffuse metal ions derived from the ionizable metallic layer through the intermediate layer in order to form a doped intermediate layer, or in other words to form a chalcogenide material containing metal ions.

The diffusion step iv is preferably only carried out after steps ii and iii, such that the layer formed in step ii remains a layer that has been irradiated, and the layer formed after step iv does indeed become a doped layer.

In a preferred implementation of step iv, the metal ion diffusion is carried out by irradiation with ultraviolet radiation and/or by heat treatment, these two types of diffusion being well known to the skilled person.

Furthermore, steps iii and iv in the fabrication method of the invention may be repeated at least n times, n being a number greater than or equal to 1; preferably, n≥5, preferably n≥7, and particularly preferably n≤20.

In the present invention, the first electrode may conventionally be deposited on a substrate. The term "substrate" means any type of structure, such as semiconductor substrates in particular, that can be conventionally based on silicon and/or quartz. As an example, the semiconductor substrate may be selected from silicon, silicon oxide, and quartz substrates.

The semiconductor substrate may, for example, comprise semiconductors of the silicon on insulator (SOI) type, silicon on sapphire (SOS) type, doped or non-doped semiconductors, or layers of silicon grown epitaxially on a semiconductor base. Steps of the method may have been used to form regions or junctions in or over the semiconductor base.

The substrate is not necessarily semiconductive, but may be of any type of support structure that is suitable for supporting an integrated circuit. As an example, the substrate may be formed from ceramic, or it may be polymer-based.

As an example, the thickness of the substrate may be from 150 μm [micrometer] to 400 μm, or even up to 800 μm.

Once doped, the intermediate layer of the invention is typically intended to form the solid electrolyte of the microelectronic device with programmable memory. Thus, in step i, this intermediate layer is preferably a non-doped layer, but is intended to be doped with metal ions originating from the ionizable metallic layer of step iii.

The layer of doped chalcogenide is conventionally interposed between the first and second electrodes in order to be able to form electrically conductive bridges when a voltage is applied between these two electrodes. Consequently, the layer of chalcogenide must be in physical contact with both electrodes.

Thus, if an intermediate layer is positioned between an electrode and the layer of chalcogenide, it is essential that the layer of chalcogenide is in electrical contact with said electrode, for example via conductive materials that can electrically connect the layer of chalcogenide to said electrode.

In accordance with the invention, the material of the intermediate layer is in particular an amorphous material.

It comprises a chalcogenide, which is preferably a chalcogenide glass.

A chalcogenide is conventionally composed of at least one chalcogen ion and at least one electropositive element.

The chalcogens constituting chalcogen ions are in group 16 of the periodic classification of the elements; those preferred for use in the invention are sulfur (S), selenium (Se), and tellurium (Te).

The electropositive element constituting the chalcogenide may in particular be an element from group 14 or group 15 of the periodic classification of the elements, preferably germanium (Ge) or arsenic (As).

Examples of chalcogenides that may be mentioned are germanium selenide $Ge_xSe_{100-x}$, germanium sulfide $Ge_xS_{100-x}$, and arsenic sulfide $As_xS_{100-x}$, x being an integer, in particular in the range 1 to 99, preferably in the range 18 to 50.

The preferred chalcogenide is germanium sulfide $Ge_xS_{100-x}$, in particular with $33 \leq x \leq 44$, and more particularly preferably with x=33.

The intermediate layer may typically be deposited by a method that is well known to the skilled person, such as cathode sputtering.

By way of example, the thickness of the intermediate layer may be in the range of 15 nm to 100 nm, preferably in the range of 20 nm to 50 nm.

The ionizable metallic layer of the invention is a layer comprising a metallic element, said metallic element being intended to dope the intermediate layer. Preferably, the metallic layer comprises just one or more metallic elements (i.e. an alloy); preferably, it comprises just one metallic element.

Said metallic element may be selected from silver (Ag), copper (Cu), and zinc (Zn), or a mixture thereof; the particularly preferred element is silver or a silver alloy.

Step iii of the invention may preferably be carried out by cathode sputtering, in particular in argon; this method is familiar to the skilled person.

The first and second electrodes of the invention are in particular metallic electrodes produced and deposited using techniques that are well known to the skilled person. They respectively correspond to an anode and to a cathode or vice versa.

More particularly, for CBRAMs (or PMCs), these two electrodes are configured to cause a metallic dendrite to grow (i.e. formation of an electrically conductive bridge) from the negative of the two electrodes to the positive of the two electrodes through the doped intermediate layer when a voltage is applied between said electrodes. By applying an opposite voltage between these two electrodes, the reverse phenomenon is obtained, namely disappearance of the metallic dendrite (i.e. disappearance of the electrically conductive bridge) inside the doped intermediate layer.

The first electrode may typically be a nickel, tungsten, nickel alloy, or tungsten alloy electrode.

The second electrode is typically a silver or silver alloy electrode.

In a further aspect, the invention provides a microelectronic device with programmable memory, obtained by the method as defined in the present invention.

This microelectronic device thus comprises an intermediate layer irradiated with ultraviolet radiation before doping, as defined in the invention, interposed between two electrodes, which guarantees it significantly improved compactness while keeping the yield optimal.

In a preferred implementation, the microelectronic device with programmable memory of the invention is a programmable ionic conduction cell (CBRAM or PMC); this type of structure being described above.

BRIEF DESCRIPTION OF THE DRAWINGS

Other characteristics and advantages of the present invention become apparent from the following examples made with reference to the accompanying figures, said examples and figures being given by way of non-limiting illustration.

DETAILED DESCRIPTION

EXAMPLES

Figure 1:
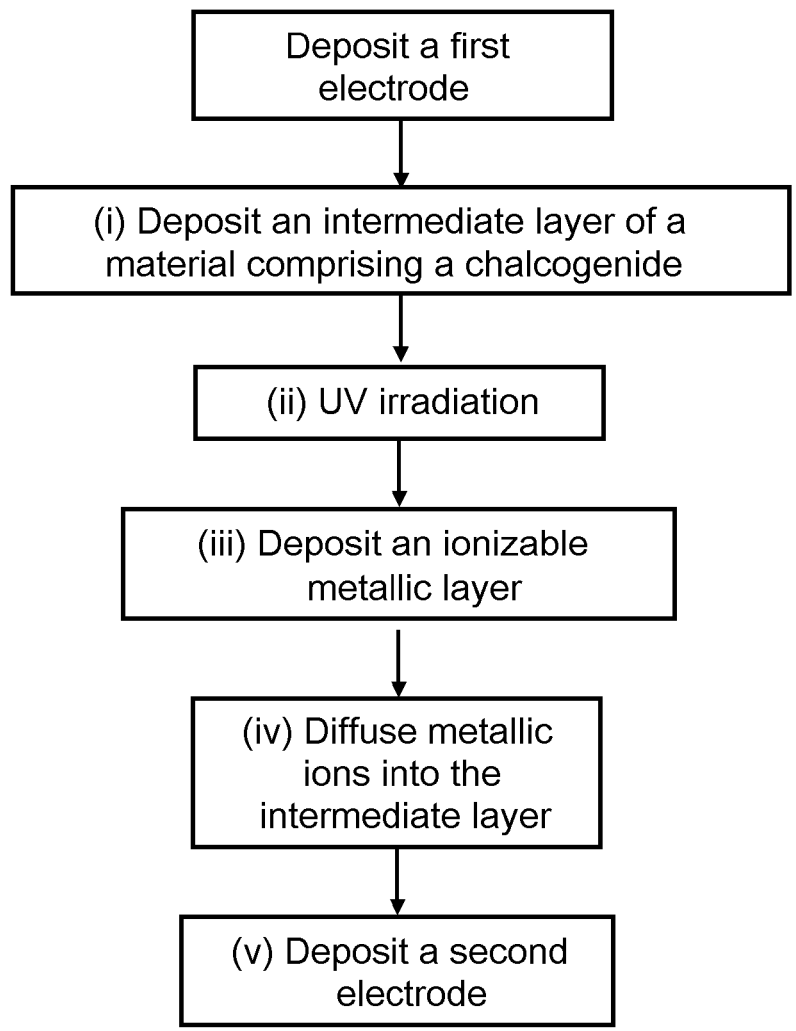
FIG. 1 is a flow chart of the method of fabricating a microelectronic device with programmable memory, of the invention.

Method 1 below makes reference to FIG. 1.
Method 1 (in Accordance with the Invention)

After producing a first electrode of the tungsten electrode type on the surface of a 200 mm [millimeter] diameter silicon substrate, a layer with a thickness of 30 nm formed from a chalcogenide glass of the $Ge_{42}S_{58}$ type was deposited on the surface of said first electrode (step i). The chalcogenide glass was deposited by sputtering in an argon atmosphere.

Next, the chalcogenide glass was irradiated (step ii) under vacuum, with ultraviolet radiation at a wavelength of 400 nm, at an intensity of 150 mW/cm², and for a period of 10 minutes.

Next, a layer of silver (Ag) with a thickness of 15 nm was deposited (step iii) by sputtering onto the irradiated chalcogenide glass layer. The layer of silver was then irradiated with ultraviolet radiation at an intensity $I_{uv}$ of 20 mW/cm² and for 300 seconds allowing silver ions ($Ag^+$) to diffuse (step iv) into the layer of chalcogenide glass, thus forming a layer of chalcogenide glass containing silver ions (i.e. a layer of chalcogenide glass doped with silver ions).

Method 2 (in Accordance with the Prior Art)

A second method was carried out, identical to method 1, but not including a step consisting in irradiating the chalcogenide glass with ultraviolet radiation at a wavelength of 400 nm, at an intensity of 150 mW/cm² and for a period of 10 minutes (cf. step ii).

Figure 2:
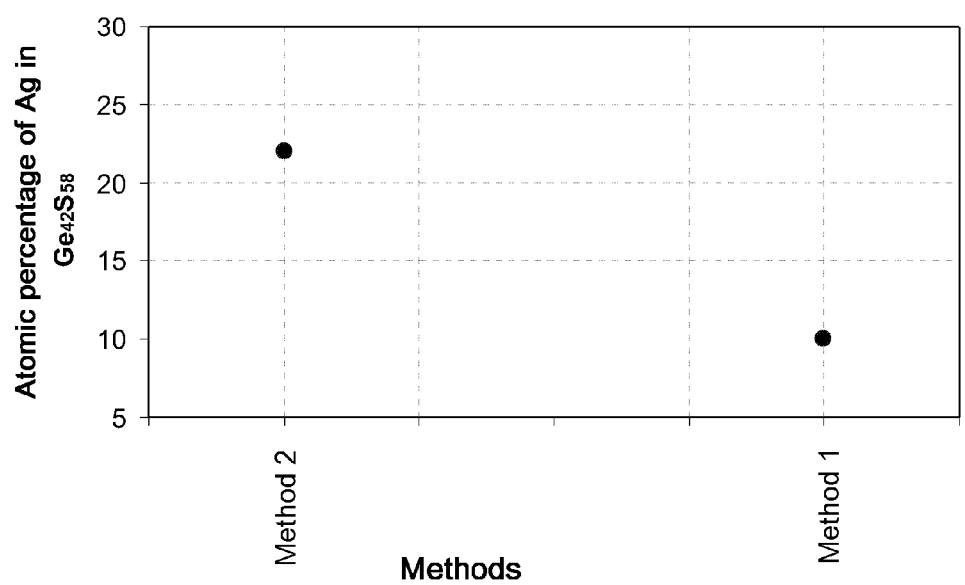
FIG. 2 shows the atomic percentage of silver dissolved in a layer of $Ge_{42}S_{58}$ by photo-doping, in accordance with the prior art and in accordance with the present invention.

The results for the atomic percentages of silver in the chalcogenide layers obtained using methods 1 and 2 are shown in the graph of FIG. 2.

These atomic percentages were determined using the "Auger Linescan" analytical method using an Auger/scanning electron microscope (SEM) model PHI670(Physical Electronics) instrument under the following Auger analysis and SEM observation conditions: voltage=10 kV [kilovolts]; current=10 nA [nanoamps]; SEM imagery spot size=50 nm; Auger analysis spot size (linescan)=10 μm.

FIG. 2 clearly shows that the quantity of silver diffused in the chalcogenide material is smaller for method 1 (method of the invention) than for method 2 (prior art method). For method 1, a silver content of 10 atomic % was obtained, while for method 2 the content was 22 atomic %. Thus, the silver-doped $Ge_{42}S_{58}$ type chalcogenide glass that had been irradiated prior to the step of depositing the layer of silver (cf. method 1) had a silver content that was reduced by 55% compared with the quantity of silver in the intermediate layer obtained by method 2.

These results are highly advantageous and demonstrate that the stoichiometry of the non-doped $Ge_{42}S_{58}$ type chalcogenide glass is substantially unchanged during the method of the invention (method 1).

This can be shown by comparing the atomic percentage of sulfur and germanium of the layer of chalcogenide $Ge_{42}S_{58}$ obtained from just steps i and ii of method 1, and from just step i of method 2.

The values for the atomic percentage (i.e. stoichiometry) of elements S and Ge were obtained by energy dispersive spectrometry coupled with scanning electron microscopy (SEM). The measurements were carried out using a Hitachi F2360N type instrument with a 7 keV [kiloelectronvolt] energy beam under a high vacuum of 1.33 Pa [Pascal], at ambient temperature.

These measurements were carried out by taking samples of the layer of non-doped $Ge_{42}S_{58}$ type chalcogenide glass, in accordance with methods 1 and 2(cf. respectively obtained from just steps i and ii of method 1, and from just, step i of method 2 at two different points : one from the center and one at the periphery 14 mm from the edge of the layer in question (the diameter of the surface of the layer was 200 mm).

Figure 3:
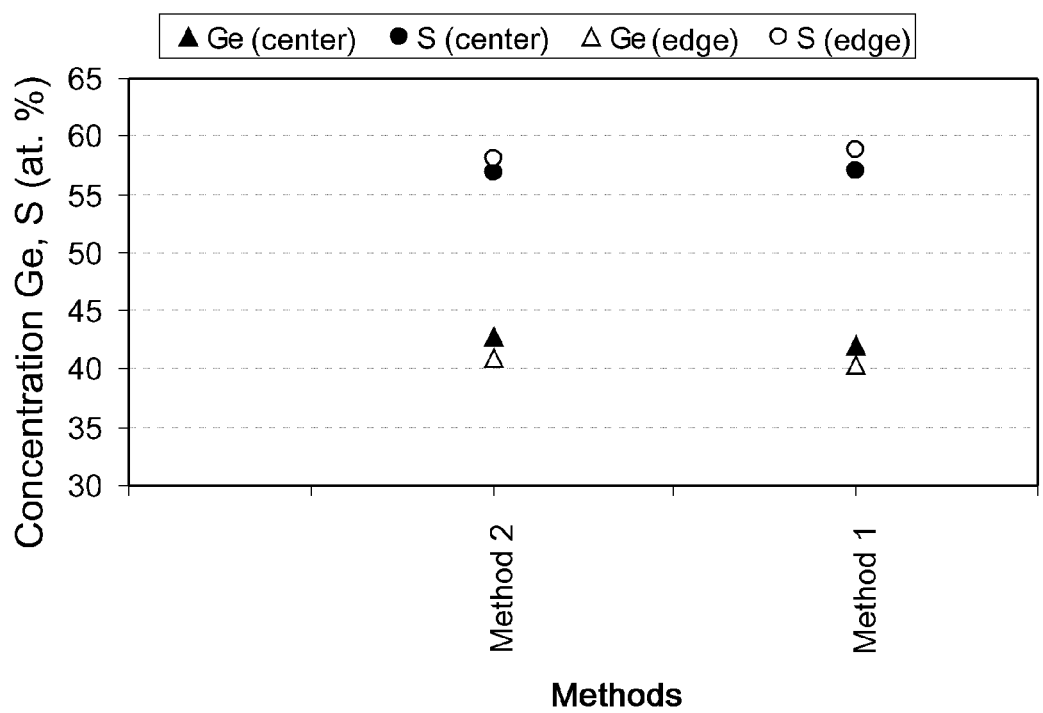
FIG. 3 shows the atomic percentage of sulfur and germanium of a layer of $Ge_{42}S_{58}$ in accordance with the prior art and in accordance with the present invention.

FIG. 3 clearly shows that the stoichiometry of the layer of chalcogenide $Ge_{42}S_{58}$ regarding sulfur and germanium is substantially identical in method 1 and in method 2.

As a consequence, the irradiation step carried out prior to the step of depositing the layer of silver in method 1 has been able to change the compactness of the $Ge_{42}S_{58}$ chalcogenide glass by reorganizing the Ge—S bonds without modifying the stoichiometry of said chalcogenide glass.

Thus, the material obtained by method 1 has a structure that is more compact, meaning that any uncontrolled, migration of metal ions (for example silver ions) by a thermal, effect during the fabrication process of the CBRAM microelectronic device is inhibited. The creation of an electrically conductive bridge is thus not perturbed and the retention time of said bridge is improved. Further, the material obtained by method 1still has an optimal stoichiometry and. thus leads to an optimized device yield.

The invention claimed is:

1. A method of fabricating a microelectronic device with programmable memory, said method comprising the steps of:
    i) depositing an intermediate layer of a material comprising a chalcogenide on a first electrode;
    ii) irradiating the intermediate layer of step i with ultraviolet radiation;
    iii) depositing an ionizable metallic layer on the intermediate layer obtained in step ii;
    iv) diffusing the metal ions originating from the ionizable metallic layer of step iii into the intermediate layer to form a chalcogenide material containing metal ions; and
    v) depositing a second electrode on the layer of chalcogenide material containing metal ions obtained in step iv to form said microelectronic device.

2. The method as claimed in claim 1, wherein the intermediate layer obtained after irradiation in step ii and diffusion in step iv has a metal ion content that is reduced by at least 20% relative to the metal ion content in the same intermediate layer obtained after diffusion in step iv, without having undergone the irradiation of step ii.

3. The method as claimed in claim 1, wherein the irradiation of step ii is carried out in a non-oxidizing atmosphere.

4. The method as claimed in claim 1, wherein the intensity of the ultraviolet radiation in step ii is at least 80 mW/cm².

5. The method as claimed, in claim 1, wherein the irradiation period of step ii is more than 5 minutes, and is preferably at least 10 minutes.

6. The method as claimed in claim 1, wherein said method further comprises a heat treatment step carried out prior to step iii, this step including heating the intermediate layer to a temperature either one of below or equal, to the glass transition temperature of said intermediate layer.

7. The method, as claimed in claim 1, wherein the diffusion of the metal ions in step iv is carried out by irradiation with ultraviolet radiation and/or by heat treatment.

8. The method as claimed in claim 1, wherein the microelectronic device with programmable memory is a programmable ionic conduction cell (CBRAM or PMC).

9. The method as claimed in claim 1, wherein the intermediate layer, intended to be irradiated in step ii, is a non-doped layer.

10. The method as claimed in claim 1, wherein the intensity of the ultraviolet radiation in step ii is greater them the intensity of the ultraviolet radiation of step iv.

11. The method as claimed in claim 1, wherein the irradiation period of step ii is greater than the irradiation period of step iv.

12. A microelectronic device with programmable memory, obtained by the method as claimed in claim 1.

13. The method as claimed in claim 4, wherein the intensity of the ultraviolet radiation in step ii is at least 150 mW/cm².

14. The method as claimed in claim 5, wherein the irradiation period of step ii is more than 10 minutes.

* * * * *